(12) United States Patent
Briand

(10) Patent No.: US 8,817,915 B2
(45) Date of Patent: Aug. 26, 2014

(54) WIDEBAND DIGITAL RECEIVER COMPRISING A SIGNAL DETECTION MECHANISM

(75) Inventor: Thierry Briand, Croissy sur Seine (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 13/139,249

(22) PCT Filed: Nov. 13, 2009

(86) PCT No.: PCT/EP2009/065102
§ 371 (c)(1),
(2), (4) Date: Aug. 11, 2011

(87) PCT Pub. No.: WO2010/069683
PCT Pub. Date: Jun. 24, 2010

(65) Prior Publication Data
US 2011/0286551 A1    Nov. 24, 2011

(30) Foreign Application Priority Data
Dec. 16, 2008   (FR) ...................................... 08 07070

(51) Int. Cl.
*H04L 27/00*   (2006.01)
*H02P 25/08*   (2006.01)
*G06F 15/16*   (2006.01)
*G01S 7/02*    (2006.01)

(52) U.S. Cl.
CPC ...................................... *G01S 7/021* (2013.01)
USPC ............................ 375/324; 318/254; 709/248

(58) Field of Classification Search
USPC .......................................... 375/324; 318/254
See application file for complete search history.

(56) References Cited

U.S. PATENT DOCUMENTS

| 4,336,541 A | 6/1982 | Tsui et al. |
| 4,547,727 A | 10/1985 | Tsui et al. |
| 4,860,318 A | 8/1989 | Shaw et al. |
| 5,440,228 A * | 8/1995 | Schmidt ...................... 324/76.12 |
| 5,477,230 A * | 12/1995 | Tsui ................................ 342/442 |
| 6,104,762 A * | 8/2000 | Fujimura ....................... 375/324 |
| 6,820,499 B2 * | 11/2004 | Brockhaus ................. 73/861.17 |

(Continued)

FOREIGN PATENT DOCUMENTS

| FR | 2695730 A1 | 3/1994 |
| WO | 2007/090730 A1 | 8/2007 |

OTHER PUBLICATIONS

Adam Konrad Rutkowski et al.: "Identification of frequencies and amplitudes of microwave simultaneous signals by means of IFM methods", Microwaves, Radar and Wireless Communications, 2008. Mikon 2008. 17th International Conference on, IEEE, Piscataway, NJ, USA, May 19, 2008, pp. 1-4, XP031324644.

(Continued)

*Primary Examiner* — Leon-Viet Nguyen
*Assistant Examiner* — Sarah Hassan
(74) *Attorney, Agent, or Firm* — Baker & Hostetler LLP (57) ABSTRACT

A wideband microwave digital receiver comprises an antenna, an amplifier, and a digital IFM device for measuring the frequency of the received signal or signals. A consistency indicator indicates the consistency of the frequency measurements and is calculated by analyzing the values taken by said measurements obtained over two consecutive transforms. The presence of signal pulses at the input of the receiver is detected when said indicator signals the consistency of at least one frequency measurement.

9 Claims, 4 Drawing Sheets

(56) References Cited

U.S. PATENT DOCUMENTS

| | | | |
|---|---|---|---|
| 7,035,593 B2* | 4/2006 | Miller et al. | 455/67.11 |
| 7,266,465 B1 | 9/2007 | Tsui et al. | |
| 7,330,581 B2* | 2/2008 | Ishikawa | 382/145 |
| 2002/0143998 A1* | 10/2002 | Rajagopal et al. | 709/248 |
| 2003/0071588 A1* | 4/2003 | Iwaji et al. | 318/254 |
| 2005/0027513 A1* | 2/2005 | Kanno | 704/10 |
| 2008/0059456 A1* | 3/2008 | Chowdhury et al. | 707/5 |
| 2010/0069030 A1* | 3/2010 | Briand et al. | 455/205 |
| 2011/0286552 A1 | 11/2011 | Briand et al. | |

OTHER PUBLICATIONS

Adam Konrad Rutkowski et al., "Measurement of Microwave Signals Intrapulse Parameters by Means of IFM Methods", Microwaves, Radar and Wireless Communications, 2008. Mikon 2008, 17th International Conference on, IEEE, Piscataway, NJ, USA, May 19, 2008, pp. 1-4, XP031324668.

* cited by examiner

WIDEBAND DIGITAL RECEIVER COMPRISING A SIGNAL DETECTION MECHANISM

CROSS-REFERENCE TO RELATED APPLICATIONS

This application is a National Stage of International patent application PCT/EP2009/065102, filed on Nov. 13, 2009, which claims priority to foreign French patent application No. FR 08 07070, filed on Dec. 16, 2008, the disclosures of which are incorporated by reference in their entirety.

FIELD OF THE INVENTION

The invention relates to a wideband digital receiver comprising a signal detection mechanism.

BACKGROUND OF THE INVENTION

Receivers that are intended for the detection of radio frequency signals, for example of radar type, must be able to monitor wide frequency bands notably in the microwave domain. They must be able to detect, for example, radar signal pulses. These pulses may exhibit "chirp" type or phase code type modulations, these modulations being used by the radar to compress the pulse on reception. The pulses may also be unmodulated, other than by the all-or-nothing modulation defining the pulse. The role of these receivers is, among other things, to estimate the frequency or frequencies of the received signal or signals, and their amplitude.

Although digital processing operations are normally involved in the architecture of these receivers, the current solutions for estimating the frequencies of the received signals, hereinafter in the description designated by the acronym IFM (Instantaneous Frequency Measurement), are mostly based on analog techniques.

As an example, one existing solution for an instantaneous measurement of the frequency of the received signal is based on the creation of a regime of standing waves in a propagation line attacked at one of its ends by the signal and at the other by the delayed signal. The periodicity of the nodes and of the antinodes gives a rough measurement of the frequency of the received signal. The measurement of the positions of the nodes and of the antinodes distributed along this line gives a fine measurement of the frequency of the received signal. This type of IFM is called a frequency meter with spatial sampling.

Another solution of the prior art, which is very widely used, is based on self-correlators, or phase meters. The principle in this case is to directly measure the phase difference $\phi$ induced by a delay line and deduce the frequency therefrom. Several stages, placed in parallel, are generally needed to ensure the desired frequency band and accuracy.

The receivers that implement these solutions use analog functions and are therefore subject to drifts such as delay variations according to temperature, or according to measurement, level or phase shift imperfections. This results in a bulky and very costly architecture.

More recently, a French patent application relating to a frequency measurement wideband digital receiver filed under the number 06/01205 describes, unlike the previous two examples, a way of digitizing the signal at the input, and of performing all the processing operations in digital mode. The digitization is performed at a sampling frequency far below the Shannon criterion. This is reflected in an ambiguous frequency measurement $F_{measure}$, also called fine frequency hereinafter in the description, said frequency being able to be described by the following expression:

$$F_{measure} = \pm(F_{real} - j \times F_e) + \delta F \qquad (1)$$

in which $F_{real}$ is the real frequency of the received signal, j a positive integer, $F_e$ the sampling frequency of the system and $\delta F$ the measurement error due mainly to the signal-to-noise ratio.

To resolve this ambiguity, N measurement channels are used in parallel, with offset sampling frequencies. The N ambiguous frequency measurements are associated to resolve said ambiguity and obtain a measurement of the real frequency of the incident signal. This measurement is called final frequency hereinafter in the description.

When an instantaneous frequency measurement device is used, said device is usually coupled with a second device whose function is to measure the amplitude. This makes it possible notably to detect the presence or absence of signals and their associated characteristics. This is because these IFMs operate in a wide dynamic range. This is achieved through the use of a limiting amplifier at the head of the device and eliminates any level information. This type of IFM therefore does not have any inherent capability of detecting the envelope of the received signal pulses. This is why it is usually associated with a level measurement device, for example of DVLA (Detector Logarithm Video Amplifier) type. The latter supplies additional information on the amplitude of the received signal or signals and makes it possible notably to validate or invalidate the frequency measurement produced by the IFM and to estimate the envelope of the received signals. Adding such a device de facto induces a greater size and cost.

SUMMARY OF THE INVENTION

One aim of the invention is notably to minimize the above-mentioned drawbacks.

To this end, the subject of the invention is a wideband microwave digital receiver comprising at least an antenna, an amplifier and a digital IFM device for measuring the frequency of the received signal or signals. A consistency indicator for indicating the consistency of the frequency measurements is calculated by the receiver by analyzing the values taken by said measurements obtained over two consecutive transforms and the presence of signal pulses at the input of the receiver is detected when said indicator signals the consistency of at least one frequency measurement.

The envelope of the received pulse or pulses is estimated by using at least the consistency indicator and the frequency measurements calculated by the IFM.

The signals received by the receiver are, for example, radar pulses.

According to one aspect of the invention, the consistency indicator is a binary indicator.

According to one embodiment, the receiver associates a detected signal pulse with a detection track, a detection track being defined by a frequency value $F_{current}$ and a frequency deviation $\Delta_{detec}$. A frequency measurement is associated with said track when the latter belongs to the frequency band $F_{current} +/- \Delta_{detec}$.

Distinct signal pulses overlapping in time are detected, for example, by keeping several detection tracks open simultaneously.

According to another aspect of the invention, the time of arrival TOA of a detected pulse corresponds to the time of opening of the detection track associated with said pulse.

The width of a detected pulse LI can be determined by the difference between the time of the last measurement assigned to this track and the time of opening of the detection track associated with said pulse.

The detection track or tracks open at a given instant are, for example, closed when a predefined number of frequency measurements are successively deemed inconsistent.

The receiver according to the invention notably has the advantage of being able to detect the presence and the envelope of one or more signals by exploiting the results of the operations performed by the digital IFM. This makes it possible to have a receiver architecture that does not require any level measurement device and therefore reduces the complexity of said receiver, and consequently its cost.

BRIEF DESCRIPTION OF THE DRAWINGS

Other features and advantages of the invention will become apparent from the following description given as a nonlimiting illustration, and in light of the appended drawings in which.

DETAILED DESCRIPTION

Figure 1:
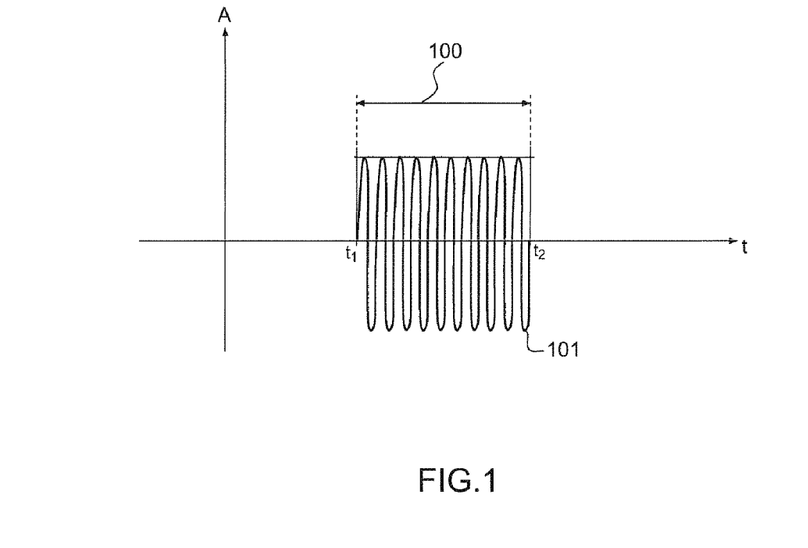
FIG. 1 gives an example of a signal pulse and its characteristics.

FIG. 1 gives an example of a signal pulse 100 and its characteristics. The aim of the wideband receiver according to the invention is notably to detect microwave signal pulses. This detection may be performed, for example, in two stages. In a first stage, the receiver comprising a digital IFM checks for the presence of one or more pulses in receive mode by checking the consistency of the frequency measurements. The concept of consistency of the measurements is detailed later in the description. In a second stage, the characteristics of the pulse are acquired by analyzing the measurements. An example of a signal pulse in the time domain is represented in FIG. 1. In this example, the pulse corresponds to a pure sinusoid, that is to say an unmodulated signal, received at the time $t_1$ and ending at the time $t_2$.

The parameters associated with the pulse, that the invention seeks to estimate, are notably the time of arrival of the pulse, usually designated by the acronym TOA, the pulse width designated by the acronym LI and the center frequency of the signal forming said pulse.

The time of arrival of the pulse TOA corresponds to the time $t_1$. The pulse width LI 100 is defined by the difference between the end time of the pulse $t_2$ and the time of arrival of the pulse $t_1$, or in other words $LI=t_2-t_1$.

The pulse can also be characterized by the center frequency of the signal 101 contained in said pulse, and when the latter is modulated, by frequency and phase modulation parameters.

All of these characteristic parameters of a pulse form what is called the envelope of the pulse in this description.

Figure 2:
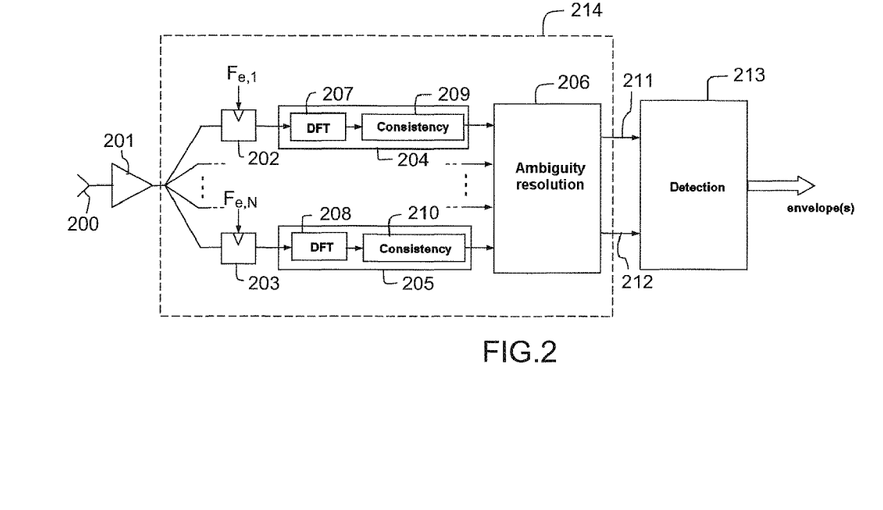
FIG. 2 shows an example of a wideband digital receiver comprising a frequency measurement mechanism and an envelope detection mechanism.

FIG. 2 shows an example of a wideband digital receiver according to the invention comprising a receiving microwave circuit 200, 201, a frequency measurement device IFM 214 and an envelope detection device 213. The receiver comprises at least a receiving antenna 200. The signal or signals received by said antenna are amplified 201 then distributed over N digital processing channels. On each channel, the signal may be, for example, digitized on one bit by a flip-flop 202, 203 whose passband covers the range of the band to be processed. The N sampling frequencies denoted from $F_{e,1}$ to $F_{e,N}$ are chosen to be below the Shannon sampling criterion and slightly offset from one another. In other words, if $F_{max}$ is the maximum frequency of the signal or signals to be received, the N sampling frequencies are chosen to be less than $2 \times F_{max}$.

Each processing channel comprises a digital frequency meter 204, 205 whose output is an ambiguous frequency measurement of the received signal as expressed previously by the equation (1). These digital frequency meters perform discrete Fourier transforms 207, 208, usually designated by the acronym DFT, and are performed continuously with a time overlap, for example, of 50%. A maximum detection is performed on each transform result $DFT_i$, i designating the time index of said transforms. A so-called rough frequency measurement denoted $FG_{k,i}$ is then available. The frequency resolution $R(FG_{k,i})$ of this measurement can be expressed by using the following expression:

$$R(FG_{k,i}) = \frac{F_{e,k}}{N\_pt\_DFT\_k} \quad (2)$$

in which N_pt_DFT_k is the number of points of the discrete Fourier transform for the processing channel number k and $F_{e,k}$ the sampling frequency used for this same channel.

The measurements are sent periodically every τ seconds, τ being able to be expressed by:

$$\tau = \frac{N\_pt\_acq\_k}{2 \times F_{e,k}} \quad (3)$$

in which N_pt_acq_k represents the number of signal acquisition points used on the channel k.

The accuracy of the frequency measurement obtained at this stage is inadequate compared to the required accuracy.

The purpose of the next processing circuit 209, 210 is to test the consistency of the rough frequency $FG_i$ obtained over 2 consecutive transforms, and if necessary to calculate the fine frequency. A consistency criterion is, for example, to check whether the deviation between $FG_{k,i}$ and $FG_{k,i-1}$ is greater than a line of the DFT. If it is, the channel k is considered inconsistent and the measurement of index i of the channel k is invalidated. Otherwise, the channel is considered consistent and the measurement is validated and the value of the measurement is the result of the fine frequency calculation.

The calculation of the fine frequency is based on the phase difference between two consecutive DFTs. These two DFTs are performed on integration supports that are offset by a time τ. In the case of a pure sinusoid, that is to say an unmodulated signal, they exhibit a phase difference that can be expressed using the following expression:

$$\Delta\phi = 2 \times \pi \cdot F_{measure} \tau \quad (4)$$

The phase shift is measured modulo 2π. This ambiguity is resolved by the rough frequency measurement.

The N channels operate in parallel and are synchronized, that is to say that the acquisition sequences have the same duration, in other words 2×τ with an overlap of 50%, and are simultaneous on the N channels. To obtain this synchronization, the value of τ is the same on the N channels. The sampling frequency offsets are compensated by values of the number of acquisition points chosen to be slightly different on each channel, or $$\frac{N\_pt\_acq\_k}{2 \times F_{e,k}} = \tau = Cte$$

for any k.

The DFT calculations can be done either on the same number of points as N_pt_acq_k, which requires particular algorithms, or on a greater number of points to reach the higher value of $2^n$ by filling with zeros. Thus, it is possible to use the conventional fast Fourier transform (FFT) algorithms.

Given that the N processing channels supply received frequency measurements to within an ambiguity, it is necessary to add a mechanism that makes it possible to obtain a reliable measurement. For this, an ambiguity resolution device 206 may be used.

On a channel, if the consistency test is satisfied (stability of the rough frequency), a fine frequency measurement is available. Depending on the number of consistent channels, 0 to N fine frequency measurements are available at the input of the ambiguity resolution device 206. For a value of $F_{max}$ that is very high compared to $F_e$ and a suitable frequency plan (choice of $F_{e,k}$), three correct fine measurements make it possible to resolve the ambiguity. The aim of the ambiguity resolution is to provide only correct measurements of the real frequency. It is possible for a fine frequency measurement to be wrong, for example, when the signal-to-noise ratio is too low or in the presence of disturbing signals. It is possible to choose N>3, for example N=4, and rejection criteria may be put in place in order to eliminate the measurements that may be incorrect. The idea is then to put in place a redundancy that makes it possible to detect and correct certain error cases, and in these cases the final measurement is declared consistent, or else detect certain error cases without being able to correct them, and in these cases the final measurement is declared inconsistent. In the context of this redundancy, a choice is made not to prefer one channel over another. As an example, if N=4, it may be decided to declare the final measurement inconsistent if fewer than three channels are consistent. When at least three channels are consistent, the ambiguities on the fine frequency measurements supplied by these consistent channels must then be resolved.

For an ambiguous measurement on a channel, there are a number of possible input frequencies $F^p_{k,i}$. This is what is indicated by the following expression:

$$F_{k,i}^p = +FF_{k,i} + j \times F_{e,k} \quad (5)$$

in which j is a positive integer and $FF_{k,i}$ is the frequency measured at the level of the channel k and is between 0 and $F_{e,k}/2$.

The number of possibilities is dependent on the subsampling rate, and therefore on the choice of the sampling frequencies $F_{e,k}$ for each branch. The principle of the ambiguity resolution is, for example, to search among these possible frequencies $F^p_{k,i}$ for the candidates that exhibit deviations between channels below a given threshold. For example, if there are 3 consistent channels, a triplet is sought among the possible frequencies. Since a value $F^p_{k,i}$ is available for each channel, the triplet should exhibit deviations between channels below a threshold. When such a triplet is found, the fine frequency measurement is declared consistent and the value supplied at the output 211 is the average of the three candidates selected. If no triplet satisfies this criterion, the measurement of the final frequency is declared inconsistent. A consistency indicator 212 for indicating the consistency of the measurement may be presented at the output of the ambiguity resolution device in parallel with the measured fine frequency value.

When the N channels are consistent, it is possible that, despite everything, a channel may be false. To improve the reliability of the fine frequency measurement, it is possible to add a safety mechanism based on the checking of a reliability criterion. By using an example in which N=4 and in which the four channels are deemed consistent, a search for four triplets may then be performed among the possible frequencies $F^p_{k,i}$ exhibiting deviations between channels below a reliability threshold.

If the 4 triplets observe the reliability criterion, which amounts to finding a group of 4 possible frequencies exhibiting deviations between channels below the reliability threshold, the final measurement is declared consistent and the measurement supplied is the average of the four candidates selected.

If just one triplet observes this criterion, the final measurement is declared consistent and the measurement supplied is the average of the 3 candidates of this triplet. This amounts to considering that the channel which has not contributed to this triplet is false. In the other cases, the final measurement is declared inconsistent.

Particular cases may be distinguished for certain frequencies called particular frequencies. For example, if $F_{real}$ is close to $j \times (F_{e,k}/2)$ on one channel, then the phase of the DFT is no longer representative of the signal. The fine frequency deriving from this phase does not improve the accuracy on this channel. The accuracy is reduced to the resolution of the DFT. To limit the error on the final frequency, when a channel is close to $j \times (F_{e,k}/2)$, the measurement on this channel participates in the ambiguity resolution, but does not participate in the average calculation for the final measurement.

For the other particular frequencies, notably when $F_{real}$ is close to $j \times F_{e,k}/2 + F_{e,k}/4$, $j \times F_{e,k}/2 + F_{e,k}/6$ or $j \times F_{e,k}/2 + F_{e,k} \times (2/6)$, the phase of the DFT, and therefore the fine frequency calculation, is disturbed, but to a lesser degree. It is not then essential to perform a particular processing operation for these frequencies because the average with the other channels gives a sufficiently low error on the final measurement.

In order to analyze the properties of the signal pulses, a detection device 213 exploiting the frequency measurement values 211 in parallel with the consistency information 212 may be implemented. The operation of the latter is described using the examples of FIGS. 3 and 4.

The functions performed by the N frequency estimation channels 204, 205, by the ambiguity resolution devices 206 and by the detection device 213 may be implemented, for example, in at least one FPGA-type programmable circuit.

Figure 3:
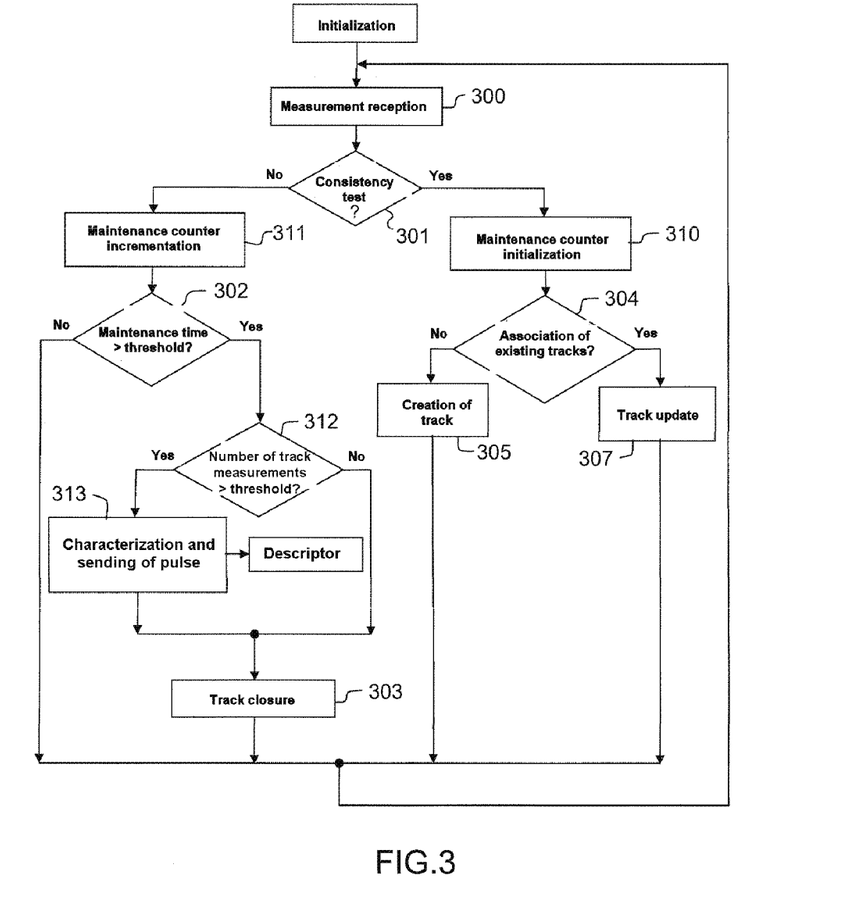
FIG. 3 shows an example of a diagram detailing the various steps leading to the detection and the acquisition of the envelope of the received pulses.

FIG. 3 shows an example of a diagram detailing the various calculation steps leading to the detection of pulses. The presence detection is based notably on the consistency indicator and the value of the frequency measurements available at the output of the digital IFM. The consistency indicator, represented for example in Boolean form with '1' meaning that the measurement is consistent and '0' that the measurement is inconsistent, is available at the output of the digital IFM shown in FIG. 2. It may be associated with a frequency tracking mechanism whose aim is to detect the envelope of the potentially received pulses. In the context of this description, the term tracking means searching for a track, a track in this case being, for example, a radar pulse. The aim of this tracking mechanism is notably to detect the envelope of the pulse or pulses exhibiting a sufficient signal-to-noise ratio. It also aims to separate the pulses that overlap in time.

The tracking mechanism according to the invention is based notably on a number of observations:

in the absence of a signal, that is to say, with only thermal noise, the frequency measurement is almost always inconsistent;

in the presence of a signal exhibiting a sufficient signal-to-noise ratio, the frequency measurement is almost always consistent;

in the presence of several simultaneous signals, with a sufficient level deviation and a sufficient signal-to-noise ratio for the strongest among them, the measurement is almost always consistent and corresponds to the strongest signal.

An example of a tracking algorithm is explained hereinbelow. The measurements are sent at the rate of $\tau$. For each received measurement 300, its consistency is checked 301 in order to take into account only the reliable measurements. On the appearance of a consistent measurement, a maintenance counter is set to zero 310 and a check 304 is carried out to see if the incident measurement can be associated with an open track. This association is made, for example, on a frequency deviation criterion relative to a current value of the track. If there is association, the track concerned is updated 307. If there is no possible association with one of the open tracks or else if there is no open track, a new track is created 305.

On the appearance of an inconsistent measurement, the maintenance counter is incremented 311 and a check 302 is carried out to see if a maintenance time value is reached. If it is, for each open track, a check 312 is carried out to see if a minimum number of measurements is available. In this case, the track is considered to be a pulse, said pulse is then characterized and a pulse descriptor is sent with its characteristics 313. When the maintenance time is reached, whether or not a pulse descriptor has been sent, all the tracks are closed 303.

Thus, it is also possible to reject isolated false alarms, even though this case is not represented in the figure.

Furthermore, this method allows for a certain tolerance on the detection gaps. A detection gap corresponds to a situation in which measurements deemed inconsistent appear despite the presence of one or more signals at the input of the receiver. Such is, for example, the case in the presence of a signal with low signal-to-noise ratio or in the presence of two signals with the same power level.

As an example, a track interrupted by the opening of a new track is kept open. The case of long pulses of low level interrupted by a short pulse of higher level is thus processed. This case is illustrated using FIG. 4.

Figure 4:
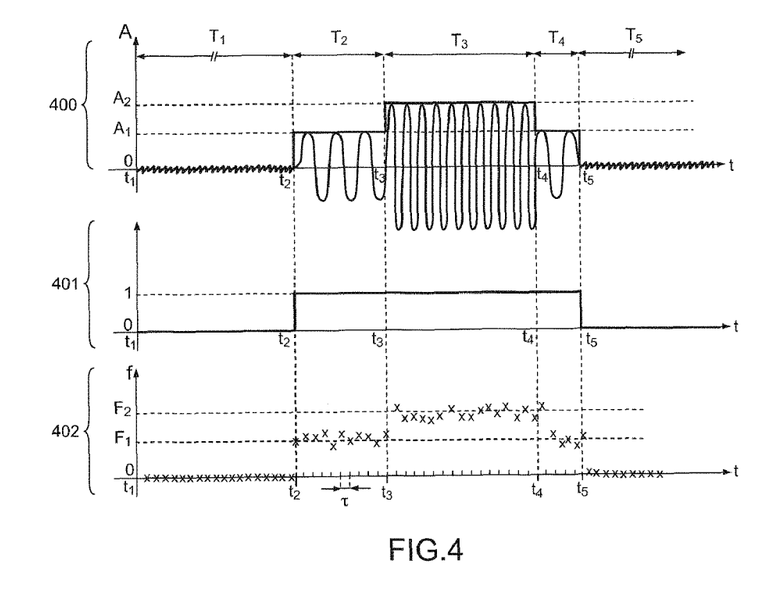
FIG. 4 graphically illustrates the case in which two signal pulses are superposed.

FIG. 4 graphically illustrates an example in which two signal pulses are superposed. The first curve 400 represents the time trend of the amplitude A of a signal portion as perceived by the receiver. In this example, two pulses are present. The signal portion may be analyzed by identifying a number of time slices denoted $T_1$ to $T_5$. During the first slice $T_1$, no useful signal is present. The signal perceived by the receiver corresponds notably to the thermal noise of the receiver. A first signal pulse is received during the next three time slices $T_2$, $T_3$ and $T_4$. In the example, this pulse corresponds to a sinusoid of frequency $F_1$ and of amplitude $A_1$. A second sinusoidal pulse of frequency $F_2$ and of amplitude $A_2$, with $A_2 > A_1$, is also present during the third time slice $T_3$. This second pulse is therefore received at the same time as a part of the first pulse and is predominant over the latter because of its amplitude. The final slice $T_5$ does not include any useful signal and has the same properties as the first slice $T_1$.

The second curve 401 represents the trend of the consistency indicator defined previously. During the slices $T_1$ and $T_5$, the frequency estimations are deemed inconsistent and consequently the Boolean consistency information takes the value '0'. During the slices $T_2$, $T_3$ and $T_4$, a useful signal is present and the estimations supplied by the digital IFM are deemed consistent. The consistency indicator then takes the value '1'.

The third curve 402 shows, in the form of crosses, the frequency values estimated by the wideband receiver taken into account to perform the detection of the envelope of the pulses according to the invention. During the slices $T_1$ and $T_5$, the consistency indicator is at '0', and there is no frequency measurement supplied. On the other hand, during the slices $T_2$, $T_3$ and $T_4$, the consistency indicator is at '1' and the values of the frequency estimations are taken into account for the detection of the envelope of the pulses. During the slices $T_2$ and $T_4$, only the signal corresponding to the first pulse is received. The frequency measurements will therefore be associated with a detection track. This track can be defined by a frequency value $F_{current}$ and a frequency deviation $\Delta_{detec}$, a fine frequency measurement being associated with said track when the latter belongs to the frequency band $F_{current} +/- \Delta_{detec}$. The frequency estimations are, for this detection track, close to the frequency $F_1$ to within an estimation error. During the slice $T_3$, the two signals corresponding to the two pulses are present, but as indicated previously, the second pulse is predominant. The frequency estimations available are then close to $F_2$ to within an error. These measurements are then associated with a second detection track. These are the frequency estimations which will be used in order to estimate the envelope of these two pulses, for example using the method described using FIG. 3.

The result obtained is then:

for the first pulse, TOA=$t_2$ and LI=$t_5-t_2=T_2+T_3+T_4$. The estimated frequency is equal to $F_1$ to within an estimation error;

for the second pulse, TOA=$t_3$ and LI=$t_4-t_3=T_3$. The estimated frequency is equal to $F_2$ to within an estimation error.

In this example, the results of the envelope detection are focused on the frequency, on the TOA parameter and on the pulse width LI for each pulse, but the receiver may also contain means for estimating the modulation parameters when the detected pulses are modulated.

The invention claimed is:

1. A wideband microwave digital receiver, comprising:
    a digital Instantaneous Frequency Measurement (IFM) device comprising:
    a digital frequency meter configured to measure a frequency of one or more received signals using digital transforms; and
    a processing circuit configured to determine a consistency indicator that represents a consistency of the frequency measurements, said consistency indicator being calculated by comparing two values taken by said frequency measurements obtained over two consecutive transforms, a frequency measurement being consistent if a deviation between said two values is less than or equal to a predetermined value, said processing circuit being further configured to detect a presence of signal pulses at an input of the wideband microwave digital receiver being detected when said consistency indicator signals the consistency of at least one frequency measurement.

2. The receiver according to claim 1, wherein an envelope of the received signal pulse or pulses is estimated by using at least the consistency indicator and the frequency measurements calculated by the digital IFM device.

3. The receiver according to claim 1, wherein the received signals are radar pulses.

4. The receiver according to claim 1, wherein the consistency indicator is a binary indicator.

5. The receiver according to claim 1, wherein a detected signal pulse is associated with a detection track, the detection track being defined by a frequency value $F_{current}$ and a frequency deviation $\Delta_{detec}$, a frequency measurement being associated with said detection track when the latter belongs to the frequency band $F_{current} +/- \Delta_{detec}$.

6. The receiver according to claim 5, wherein distinct signal pulses overlapping in time are detected by keeping several detection tracks open simultaneously.

7. The receiver according to claim 5, wherein time of arrival TOA of a detected pulse corresponds to a time of opening of the detection track associated with said detected pulse.

8. The receiver according to claim 5, wherein the width LI of a detected pulse is determined by the difference between a time of the last measurement assigned to this track and a time of opening of the detection track associated with said detected pulse.

9. The receiver according to claim 5, wherein the detection track or tracks open at a given instant are closed when a predefined number of frequency measurements are successively deemed inconsistent.

* * * * *